(12) United States Patent
Day et al.

(10) Patent No.: US 7,788,057 B2
(45) Date of Patent: Aug. 31, 2010

(54) TEST APPARATUS AND METHODS THEREOF

(75) Inventors: Philip Arthur Day, Ontario (CA); Kyle Robeson, Ontario (CA)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 12/018,736

(22) Filed: Jan. 23, 2008

(65) Prior Publication Data

US 2009/0187366 A1 Jul. 23, 2009

(51) Int. Cl.
*G01D 3/00* (2006.01)
(52) U.S. Cl. ...................... 702/108; 717/120
(58) Field of Classification Search ............... 702/108, 702/118, 119, 182–185; 717/100, 101, 120, 717/127
See application file for complete search history.

(56) References Cited

U.S. PATENT DOCUMENTS

| | | | |
|---|---|---|---|
| 6,668,340 B1 | 12/2003 | Baker | |
| 6,816,963 B1* | 11/2004 | Krithivas et al. | 713/1 |
| 7,020,797 B2 | 3/2006 | Patil | |
| 7,028,290 B2 | 4/2006 | Srivastava | |
| 2006/0075302 A1 | 4/2006 | Ulrich et al. | |
| 2007/0022324 A1 | 1/2007 | Chang | |
| 2008/0234873 A1* | 9/2008 | Gorbatov et al. | 700/291 |

* cited by examiner

*Primary Examiner*—Edward Raymond
(74) *Attorney, Agent, or Firm*—Novak Druce + Quigg (57) ABSTRACT

A system that incorporates teachings of the present disclosure may include, for example, an apparatus for testing having a controller to perform test case conflict resolution by comparing an execution descriptor to one or more platform descriptors. The execution descriptor can have one or more platforms to be tested, each platform comprising at least one among one or more bases, one or more modules, and combinations thereof. Each of the one or more platform descriptors can have one or more test cases and a description of one or more platform limitations for executing the one or more test cases. Additional embodiments are disclosed.

20 Claims, 5 Drawing Sheets

TEST APPARATUS AND METHODS THEREOF

FIELD OF THE DISCLOSURE

The present disclosure relates generally to testing techniques, and more specifically to a testing apparatus and methods thereof.

BACKGROUND

Complex software and hardware computing technologies can be tested with automated testing systems that utilize scripts or test cases developed by test engineers. The test cases created to test such systems are often specific to a subset of available environment configurations. Executing a given test case against an environment configuration other than what it supports can cause the test system to produce invalid results which may not be apparent to the tester.

A tester can mitigate this situation by documenting in a test plan which environment configurations a test case should be executed on as a guide to manually ensure the environment configuration is correct before the test case is executed. When selecting test cases for application across more than one platform, some testers choose to create multiple copies of each test case, one for each platform. Although this technique can be a viable approach to test multiple platforms, it can give rise to undesirable results such as a need for large storage capacity in the test system, and complex and error-prone version management across multiple platforms.

DETAILED DESCRIPTION

In one embodiment of the present disclosure, a computer-readable storage medium can have computer instructions for receiving an execution descriptor comprising one or more platforms to be tested, each platform comprising at least one among one or more bases, one or more modules, and combinations thereof, receiving one or more directory pointers directed to one or more corresponding platform descriptors, each platform descriptor comprising one or more test cases and a description of one or more platform limitations for executing the one or more test cases, identifying the one or more platform descriptors according to its corresponding directory pointer, comparing the execution descriptor with the one or more platform limitations in each of the one or more platform descriptors, identifying from the comparison one or more test cases from the one or more platform descriptors that are compatible with each of the one or more platforms to be tested, and generating for each of the identified one or more compatible test cases a corresponding one or more execution elements, each execution element comprising an identification of a select one of the platforms to be tested and the test case which is compatible with the platform.

In one embodiment of the present disclosure, an apparatus for testing can have a controller to perform test case conflict resolution by comparing an execution descriptor to one or more platform descriptors. The execution descriptor can have one or more platforms to be tested, each platform comprising at least one among one or more bases, one or more modules, and combinations thereof. Each of the one or more platform descriptors can have one or more test cases and a description of one or more platform limitations for executing the one or more test cases.

In one embodiment of the present disclosure, a method can involve resolving test case conflicts by comparing an execution descriptor to one or more platform descriptors. The execution descriptor can have one or more platforms to be tested, each platform comprising at least one among one or more bases, one or more modules, and combinations thereof. Each of the one or more platform descriptors can have one or more test cases and a description of one or more platform limitations for executing the one or more test cases.

Figure 1:
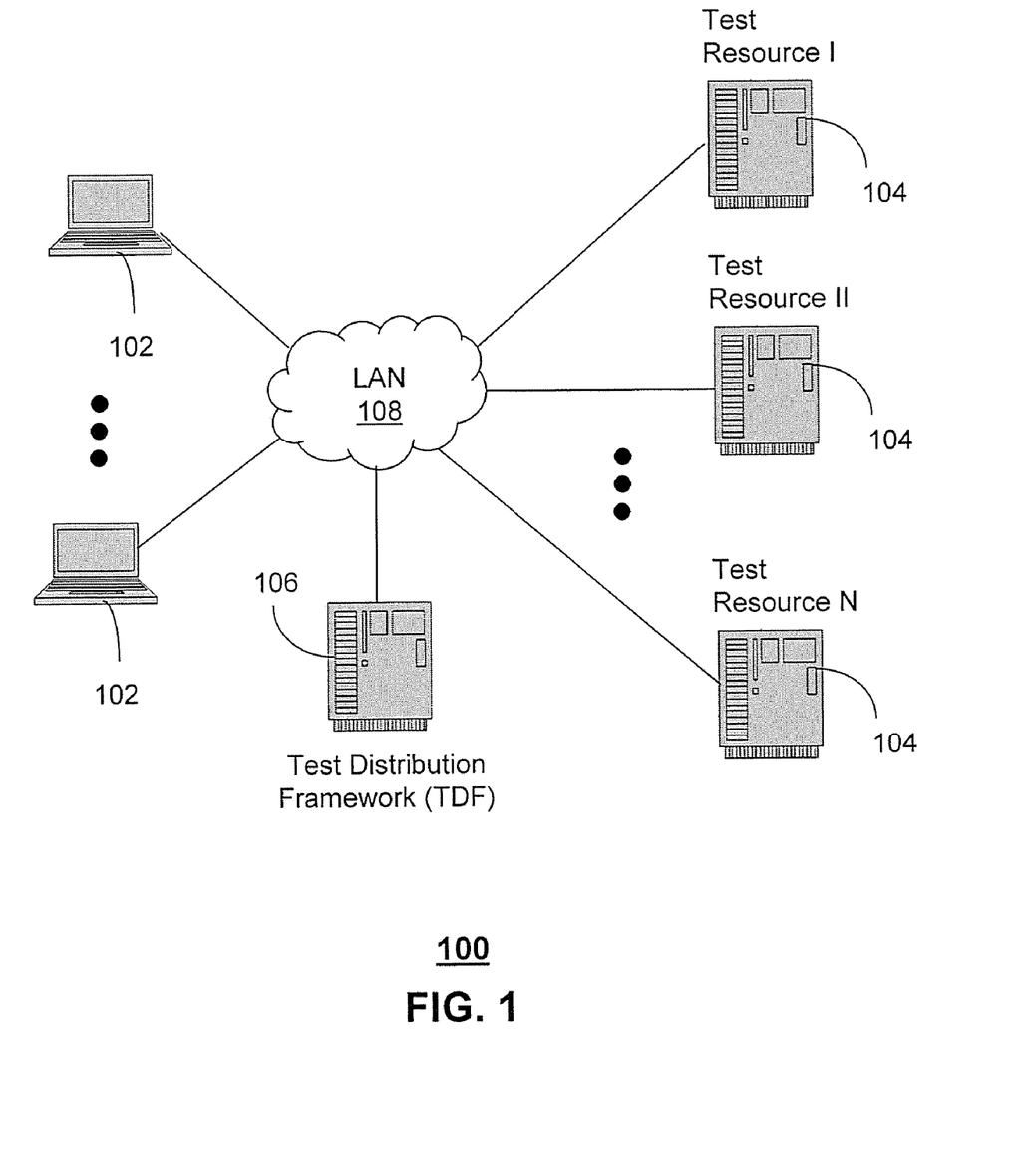
FIG. 1 depicts an exemplary embodiment of an automation test system.

FIG. 1 depicts an exemplary embodiment of an automation test system 100. The automation test system 100 can comprise one or more test resources 104 that a tester and/or test administrator can manage by way of a computing device 102 interacting with a test distribution framework (TDF) 106 over a Local Area Network (LAN) network 108 interconnecting these devices. The test resources 104 can represent a platform comprising a hardware computing resource such as a server, mainframe or distributed computing devices, one or more instantiations of an operating system (OS) managing operations of the hardware resource, and one or more software applications operating on the OS. Each testing resource 104 can utilize computing technologies supplied by a variety of vendors (e.g., IBM, HP, Dell, Sun Microsystems, etc.) configured with different operating systems (e.g., AIX from IBM, Vista from Microsoft, and so on.). Any software application compatible with an operating system is applicable to the present disclosure. For example a software application can be a web application, a customer relationship management (CRM) application, a database application (e.g., Oracle, or DB2 from IBM), a Websphere Application Server (WAS) application from IBM, and so forth.

Figure 2:
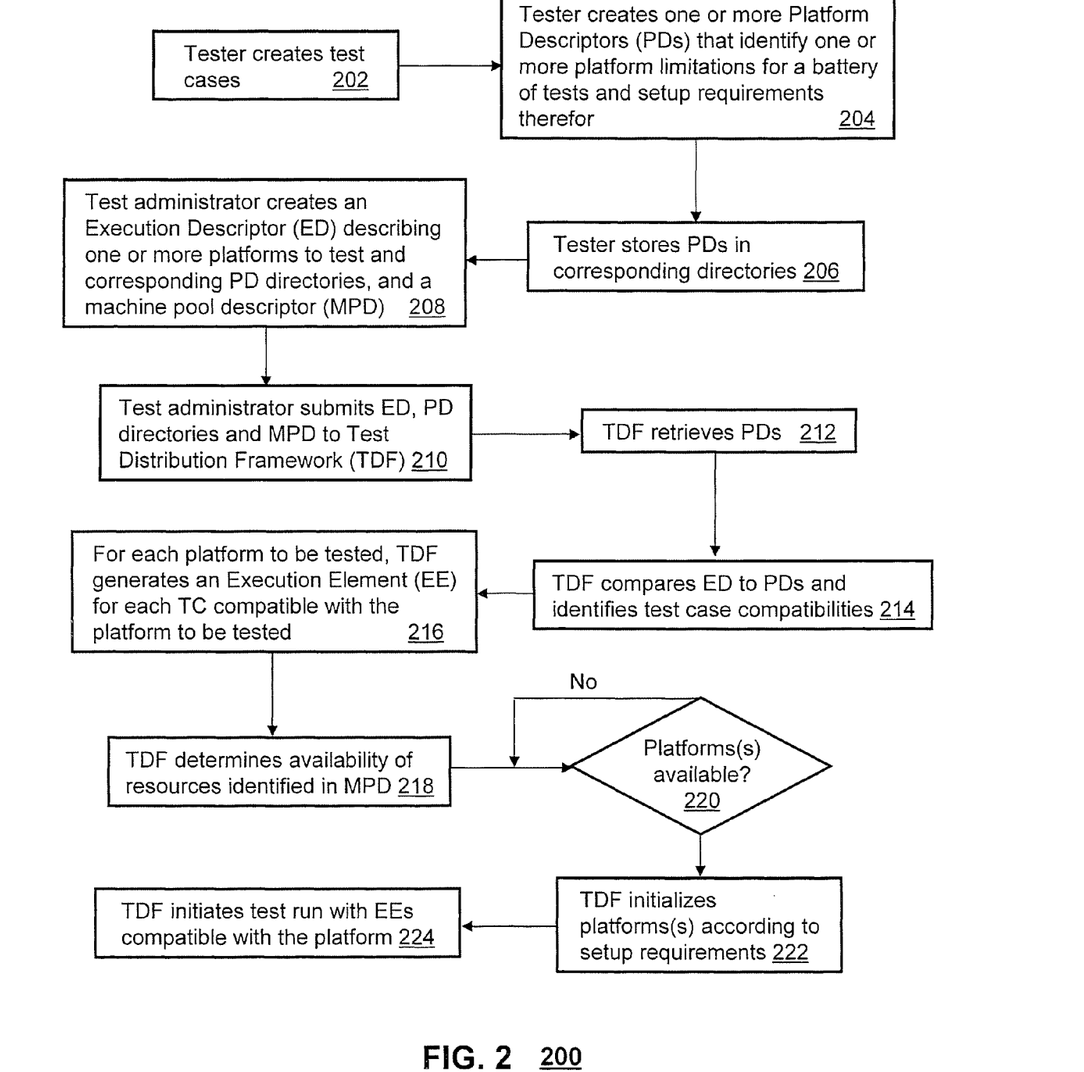
FIG. 2 depicts an exemplary method operating in portions of the automation test system.

FIG. 2 depicts an exemplary method 200 operating in portions of the automation test system 100. Method 200 can begin from step 202 where a tester creates a number of test cases. Test cases can represent test scripts written in any computing language (e.g., Java, C++, or a suitable test script language). Test cases can be directed to test features of software applications, operating systems, and/or hardware computing resources. In some instances, test cases may be created for specific test applications. For example, a test case might be designed specifically to test an Oracle database on a Sun Microsystem computer. In other circumstances, a test case might be broadly designed to operate on any hardware resource, or operating system, but can only function on specific software applications. It follows from these examples that as testers develop more and more test cases, it can become difficult to manage and track incompatibilities between test cases and the applications and hardware resources they run on.

Figure 3:
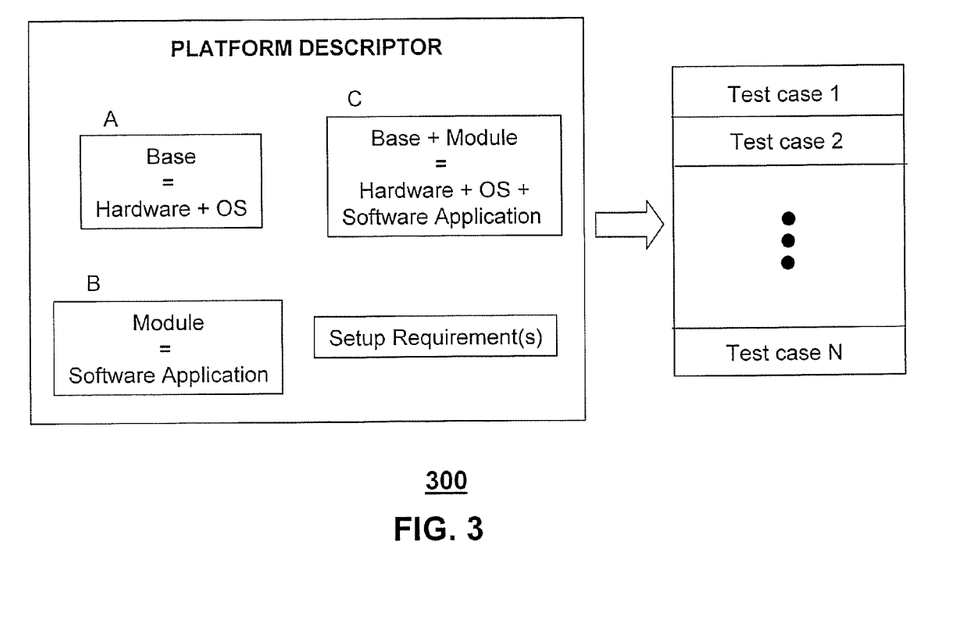
FIGS. 3-4 depict exemplary block diagrams of a platform descriptor and an execution descriptor utilized in the method of FIG. 2.

To prevent inadvertent execution of test cases on incompatible platforms, the tester can be directed in step 204 to create one or more platform descriptors (PDs) 300 as shown in FIG. 3 that identify one or more platform limitations for a battery of test cases. It should be noted that PDs 300 can be written in any suitable language descriptor such as XML (eXtensible Markup Language). A platform limitation in the present context represent a base, a module, or combinations thereof. A base can represents a hardware resource 104 such as those shown in FIG. 1 and an operating system managing said resource (e.g., IBM server managed by AIX). A module can represent a software application operating on a select operating system.

In the illustration of FIG. 3, there are three platform limitations (A, B and C). Platform A defines by way of example a base, while platform B defines just a module. Platform C defines a base combined with a module. In this illustration, test cases 1 through N can operate on either platforms A, B or C. Suppose platform A is defined by an IBM/AIX hardware and OS combination Since platform A does not indicate a module limitation for the IBM/AIX base, test cases 1 through N can operate on any module (i.e., any software application) that operates on the IBM/AIX base.

Suppose the module of platform B consists of a dB2 software application. Since platform B does not specify a base limitation for the module, the test cases can operate on dB2 on any hardware resource (IBM, HP, Dell, Sun Microsystems, etc.). Suppose base of platform C is an IBM hardware resource managed by AIX. Further suppose that the module for platform C is dB2. Platform C therefore limits the application of test cases 1-N to the base and module combination stated. In addition to the platform limitations A-C, the platform descriptor 300 can specify setup requirements for the test cases (e.g., OS conditions, memory resources, hardware peripherals needed, initialization parameters, etc.). The setup requirements can be used to initialize a hardware resource 104 before the test cases are applied.

Figure 4:
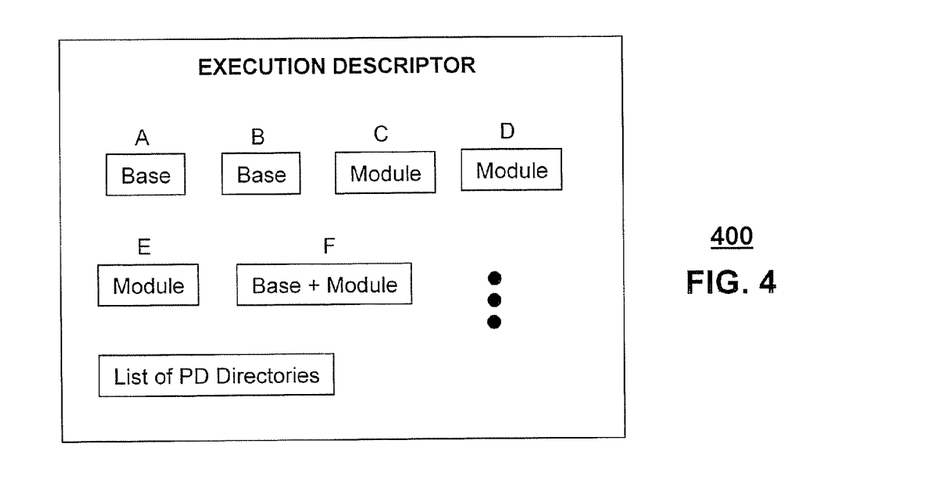
Figure 5:
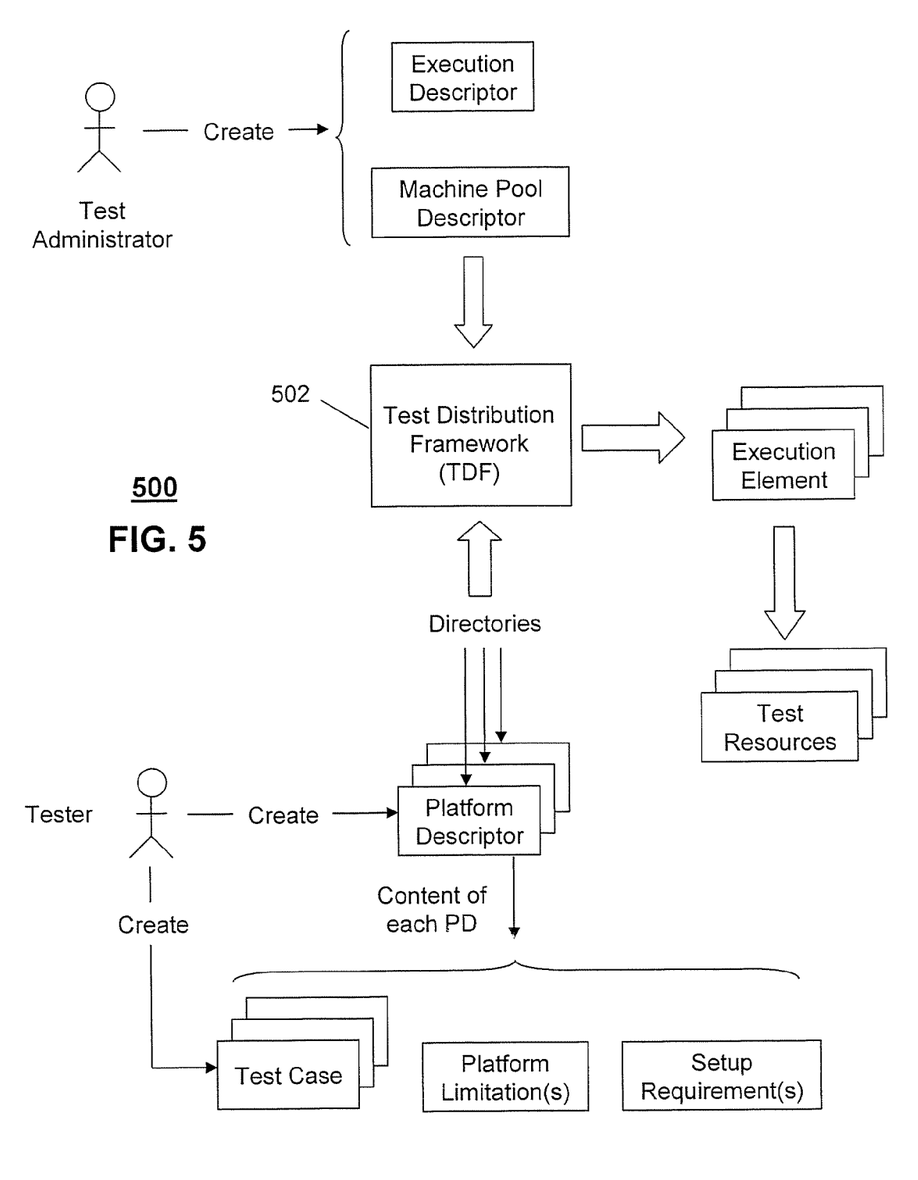
FIG. 5 depicts an exemplary block diagram that illustrates the method of FIG. 2.

The platform descriptor 300 therefore can be a collection of test cases, platform limitations, and setup requirements. A tester can create and store in step 206 a number of platform descriptors 300 each in its own directory with a corresponding list of test cases, platform limitations and setup requirements as shown in FIG. 5. Once the platform descriptors 300 have been created, a test administrator (who might be the same person as the tester) can create in step 208 an execution descriptor (ED) 400 as shown in FIG. 4. The execution descriptor 400 can identify one or more platforms to test and a corresponding list of directories of platform descriptors 300 which can be used for testing the platforms. In the same step, the test administrator can also create a machine pool descriptor (MPD) which identifies the hardware resources 104 intended to be used for the tests.

The platforms described in the ED 400 identify the configurations to be tested. These configurations are not to be confused with platform limitations as described for the PD 300. Suppose for example that platforms A and B identify respectively an IBM mainframe and an HP server, while platforms C-E identify dB2, SAP, and WAS as modules/software applications to be tested, and platform F identifies a combination of a base and a module such as IBM/AIX with dB2 operating thereon. These configurations describe which platforms are to be tested, while the list of PD 300 directories represent a library for testing these platforms with the test cases therein having certain limitations as to the scope of what they can test-as described by the platform limitations.

Once the ED 400 and MPD have been created, the test administrator can submit them in step 210 to the test distribution framework (TDF) 106 of FIG. 1, also shown in FIG. 5. The TDF 106 can represent a server, mainframe or collection of computing devices which operate according to portions of the steps depicted in method 200. For example, in step 212 the TDF 106 can be programmed to retrieve the PDs 300 listed in the ED 400 from their corresponding directories. In step 214, the TDF 106 can compare platforms listed in the ED 400 to the platform limitations listed in the PDs 300 and identify therefrom compatibilities between the desired platforms to be tested and the test cases listed in the PDs.

For example, suppose that there are only two PDs 300 identified in the ED 400. Further suppose that one PD has a base module combination of an IBM server, an AIX OS and a WAS application associated with 10 test cases. Further suppose that the other PD has a base identified as an HP server with Vista as an OS and 10 cases associated with this base. Further suppose that the ED 400 lists WAS as one module, and SAP as another. In the present instance, the TDF 106 can determine that the WAS module identified in the ED 400 can be tested on the IBM server running AIX and the HP server running Vista. Thus the WAS module can be exercised with 20 test cases supplied by both PDs 300. The TDF 106 can further determine that the SAP module can only be exercised by the 10 test cases of the PD 300 associated with the HP/Vista platform. The 10 test cases from the other PD 300 associated with the IBM/AIX/WAS platform cannot be used to test the SAP module since SAP is not listed as an option in the PD.

From the conflict checks performed in step 214, the TDF 106 can proceed to step 216 where it generates for each platform to be tested a battery of execution element (EE). For example, for the WAS module, the TDF 106 can generate 20 EEs. One set of 10 EEs is tested on the IBM/AIX/WAS resource combination, while the other set of 10 EEs is tested on the HP/Vista/WAS resource combination. Each EE identifies its platform and corresponding test case to avoid confusion between platforms under test. In the case of the SAP module, the TDF 106 can generate 10 EEs from the PD 300 associated with the HP/Vista platform. A generalized illustration of step 216 is shown in FIG. 5.

Once the EEs have been generated, the TDF 106 can proceed to step 218 where it determines whether the resources requested by the MPD are available. If one or more of the resources are available, the TDF 106 proceeds to step 222 where it initializes the platforms according to the setup requirements supplied in the PDs 300. Once initialized, the TDF 106 initiates in step 224 a test run with the EEs compatible with the platforms. Test results can be collected by the TDF 106 and supplied to the test administrator. The test administrator can create additional EDs 400 as needed to test other combinations of platforms.

From the foregoing descriptions, it would be evident to an artisan with ordinary skill in the art that the aforementioned embodiments can be modified, reduced, or enhanced without departing from the scope and spirit of the claims described below. Accordingly, the reader is directed to the claims for a fuller understanding of the breadth and scope of the present disclosure.

Figure 6:
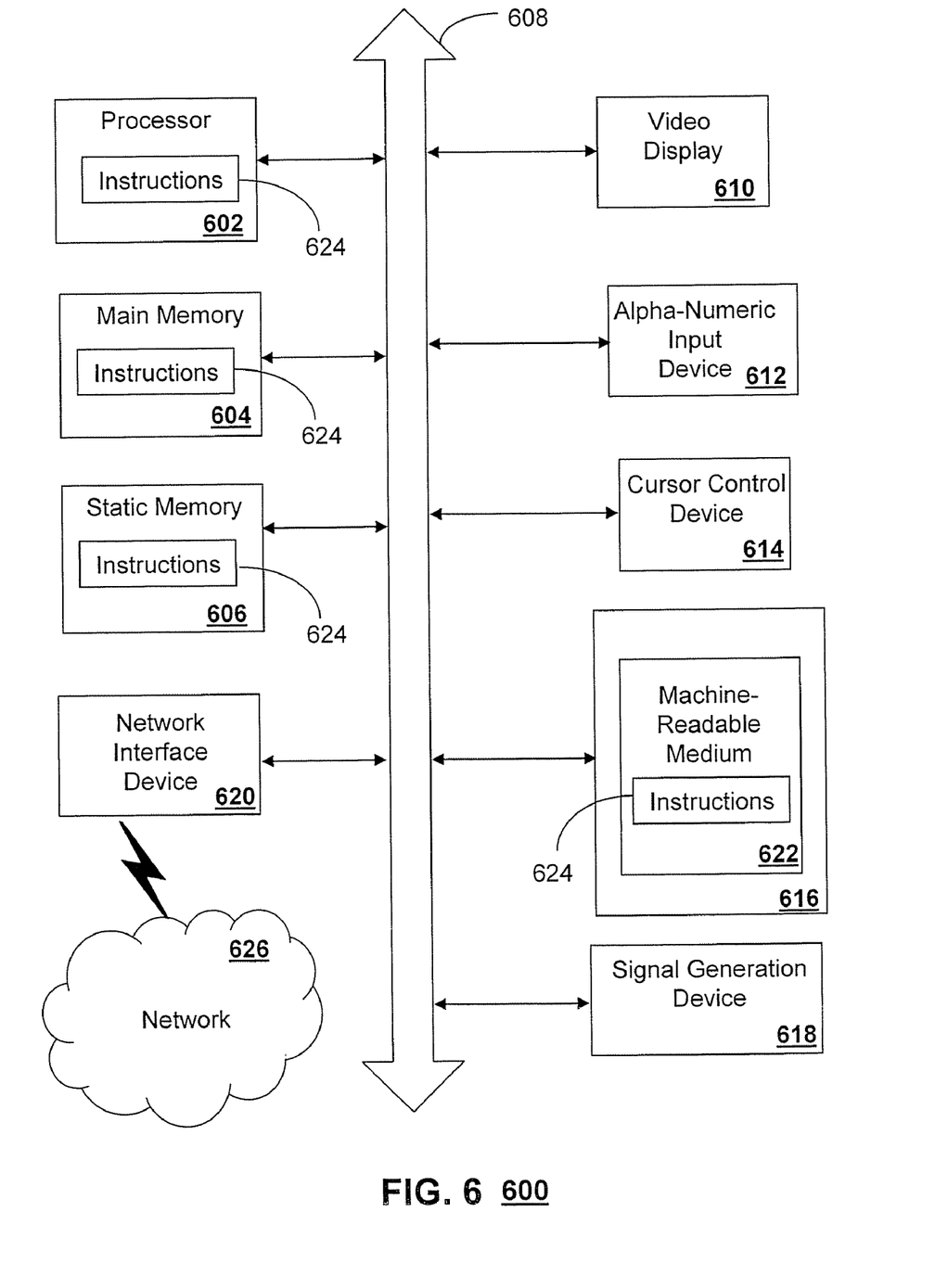
FIG. 6 depicts an exemplary diagrammatic representation of a machine in the form of a computer system within which a set of instructions, when executed, may cause the machine to perform any one or more of the methodologies disclosed herein.

FIG. 6 depicts an exemplary diagrammatic representation of a machine in the form of a computer system 600 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 600 may include a processor 602 (e.g., a central processing unit (CPU), a graphics processing unit (GPU, or both), a main memory 604 and a static memory 606, which communicate with each other via a bus 608. The computer system 600 may further include a video display unit 610 (e.g., a liquid crystal display (LCD), a flat panel, a solid state display, or a cathode ray tube (CRT)). The computer system 600 may include an input device 612 (e.g., a keyboard), a cursor control device 614 (e.g., a mouse), a disk drive unit 616, a signal generation device 618 (e.g., a speaker or remote control) and a network interface device 620.

The disk drive unit 616 may include a machine-readable medium 622 on which is stored one or more sets of instructions (e.g., software 624) embodying any one or more of the methodologies or functions described herein, including those methods illustrated above. The instructions 624 may also reside, completely or at least partially, within the main memory 604, the static memory 606, and/or within the processor 602 during execution thereof by the computer system 600. The main memory 604 and the processor 602 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 624, or that which receives and executes instructions 624 from a propagated signal so that a device connected to a network environment 626 can send or receive voice, video or data, and to communicate over the network 626 using the instructions 624. The instructions 624 may further be transmitted or received over a network 626 via the network interface device 620.

While the machine-readable medium 622 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and carrier wave signals such as a signal embodying computer instructions in a transmission medium; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure.

This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A non-transitory computer-readable storage medium, having embodied therewith computer instructions for: receiving an execution descriptor comprising one or more platforms to be tested, each platform comprising at least one among one or more bases, one or more modules, and combinations thereof; receiving one or more directory pointers directed to one or more corresponding platform descriptors, each platform descriptor comprising one or more test cases and a description of one or more platform limitations for executing the one or more test cases; identifying the one or more platform descriptors according to its corresponding directory pointer; comparing the execution descriptor with the one or more platform limitations in each of the one or more platform descriptors; identifying from the comparison one or more test cases from the one or more platform descriptors that are compatible with each of the one or more platforms to be tested; and generating for each of the identified one or more compatible test cases a corresponding one or more execution elements, each execution element comprising an identification of a select one of the platforms to be tested and the test case which is compatible with the platform.

2. The storage medium of claim 1, comprising computer instructions for receiving a machine pool descriptor identifying one or more hardware and software resources for testing.

3. The storage medium of claim 2, comprising computer instructions for:
identifying which of the one or more hardware and software resources are available for testing; and
invoking at least a portion of the one or more execution elements to test the identified hardware and software resources.

4. The storage medium of claim 3, wherein at least a portion of the one or more platform descriptors comprises a setup requirement for initializing at least one among the identified hardware and software resources, and wherein the storage medium comprises computer instructions for configuring the identified hardware and software resources according to at least one setup requirement.

5. The storage medium of claim 1, wherein at least one among the execution descriptor and the platform descriptor are described according to an eXtensible Markup Language (XML).

6. The storage medium of claim 1, wherein the one or more platform limitations in each platform descriptor comprises at least one among a first identification of one or more bases, a second identification of one or more modules, and a third identification of a combination of one or more bases and one or more modules.

7. The storage medium of claim 6, comprising computer instructions for limiting execution of a select test case to a base, a module, or a combination thereof identified in the platform limitation of the select test case.

8. The storage medium of claim 7, comprising computer instructions for:
expanding execution of the test case to any base when a base is not identified in a corresponding platform limitation of the test case; and
expanding execution of the test case to any module when a module is not identified in a corresponding platform limitation of the test case.

9. The storage medium of claim 1, wherein a base comprises a hardware resource executing a select operating system, and wherein a module comprises a software resource.

10. An apparatus for testing, comprising a controller to perform test case conflict resolution by comparing an execution descriptor to one or more platform descriptors, wherein the execution descriptor comprises one or more platforms to be tested, each platform comprising at least one among one or more bases, one or more modules, and combinations thereof, and wherein each of the one or more platform descriptors comprises one or more test cases and a description of one or more platform limitations for executing the one or more test cases.

11. The apparatus of claim 10, wherein the controller is adapted to:
identify from the comparison one or more test cases from the one or more platform descriptors that are compatible with each of the one or more platforms to be tested; and
generate for each of the identified one or more compatible test cases a corresponding one or more execution elements, each execution element comprising an identification of a select one of the platforms to be tested and the test case which is compatible with the platform.

12. The apparatus of claim 10, wherein at least a portion of the one or more platform descriptors comprises a setup requirement for initializing at least one among hardware and software resources, and wherein the controller is adapted to configure at least one among hardware and software resources according to at least one setup requirement.

13. The apparatus of claim 12, wherein at least one among the execution descriptor and the platform descriptor are described according to an eXtensible Markup Language (XML).

14. The apparatus of claim 10, wherein the one or more platform limitations in each platform descriptor comprises at least one among a first identification of one or more bases, a second identification of one or more modules, and a third identification of a combination of one or more bases and one or more modules.

15. The apparatus of claim 10, wherein the controller is adapted to limit execution of a select test case to a base, a module, or a combination thereof identified in the platform limitation of the select test case.

16. The apparatus of claim 10, wherein the controller is adapted to:
expand execution of a test case to any base when a base is not identified in a corresponding platform limitation of the test case; and
expand execution of the test case to any module when a module is not identified in a corresponding platform limitation of the test case.

17. A method of testing a plurality of platforms within a computer system, comprising resolving test case conflicts by comparing an execution descriptor to one or more platform descriptors, wherein the execution descriptor comprises one or more platforms to be tested, each platform comprising at least one among one or more bases, one or more modules, and combinations thereof, and wherein each of the one or more platform descriptors comprises one or more test cases and a description of one or more platform limitations for executing the one or more test cases.

18. The method of claim 17, wherein at least one among the execution descriptor and the platform descriptor are described according to an eXtensible Markup Language (XML).

19. The method of claim 17, wherein the one or more platform limitations in each platform descriptor comprises at least one among a first identification of one or more bases, a second identification of one or more modules, and a third identification of a combination of one or more bases and one or more modules.

20. The method of claim 17, comprising:

limiting execution of a test case to a base, a module, or a combination thereof identified in a corresponding platform limitation of the test case;

expanding execution of the test case to any base when a base is not identified in the corresponding platform limitation of the test case; and expanding execution of the test case to any module when a module is not identified in the corresponding platform limitation of the test case.

\* \* \* \* \*